United States Patent
Kurle et al.

(10) Patent No.: US 6,811,409 B2
(45) Date of Patent: Nov. 2, 2004

(54) CONNECTING DEVICE FOR FLEXIBLE ELECTRICAL CONNECTION OF CIRCUIT BOARDS

(75) Inventors: Juergen Kurle, Reutlingen (DE); Franz Schmich, Pfullingen (DE); Michael Klink, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/366,269

(22) Filed: Feb. 13, 2003

(65) Prior Publication Data

US 2004/0137766 A1 Jul. 15, 2004

(30) Foreign Application Priority Data

Jan. 9, 2003 (DE) .......................................... 203 00 294

(51) Int. Cl.[7] .............................................. H01R 12/24
(52) U.S. Cl. ........................................ 439/67; 439/940
(58) Field of Search .............................. 439/67, 77, 65, 439/492, 493, 940

(56) References Cited

U.S. PATENT DOCUMENTS

| | | | | |
|---|---|---|---|---|
| 3,601,755 A | | 8/1971 | Shiells, Jr. | |
| 5,917,149 A | * | 6/1999 | Barcley et al. | 174/35 C |
| 5,936,850 A | * | 8/1999 | Takahashi et al. | 361/784 |
| 6,123,551 A | * | 9/2000 | Westfall | 439/67 |
| 6,309,223 B1 | * | 10/2001 | Wolfe | 439/67 |
| 6,336,816 B1 | * | 1/2002 | Yatskov et al. | 439/67 |
| 6,612,851 B1 | * | 9/2003 | Goodwin et al. | 439/66 |
| 6,648,675 B2 | * | 11/2003 | Welschholz et al. | 439/492 |
| 6,663,400 B1 | * | 12/2003 | Yokoyama | 439/67 |

* cited by examiner

*Primary Examiner*—Gary Paumen
(74) *Attorney, Agent, or Firm*—Kenyon & Kenyon

(57) ABSTRACT

A connecting device for flexible electrical connection of circuit boards using a plurality of flexible electrical conductors positioned adjacent to each other. The flexible electrical conductors are jointly surrounded by an insulation of an flexible electrically non-conductive material. The end areas of the flexible electrical conductors have a first and a second contact area without insulation. The flexible electrical conductors and the insulation are plastically deformable, and are shaped in such a way that the flexible electrical conductors form a loop in the area of the insulation and run out in the form of a shoulder in the direction of the contact areas. The shoulder is shaped in such a way that the flexible electrical conductors and the insulation may be picked up by a tool and the contact areas may be connected to a circuit board by machine.

6 Claims, 3 Drawing Sheets

CONNECTING DEVICE FOR FLEXIBLE ELECTRICAL CONNECTION OF CIRCUIT BOARDS

FIELD OF THE INVENTION

The present invention is directed to a connecting device for flexible electrical connection of circuit boards.

BACKGROUND INFORMATION

A connecting device is described in U.S. Pat. No. 3,601,755, in which a plurality of wires positioned adjacent to each other are embedded in an insulation. The wires are flattened in the area of the insulation, while outside of the insulation the round shape of the wires is preserved. The round ends of the wires can be inserted into contact holes of a circuit board. The installation of such a conductor is typically performed by hand.

SUMMARY OF THE INVENTION

The connecting device according to the present invention has the advantage over the related art that the connecting device, having a plurality of conductors embedded in an insulation, is formed in such a way that the connecting device may be picked up in an advantageous manner by a tool, and the ends of the electrical conductors may be inserted into contact openings of a circuit board by machine. The electrical conductors have in their end areas a first and a second contact area without insulation. The electrical conductors and the insulation are plastically deformable, so that impressed shapes are advantageously retained. Thus the electrical conductors and the insulation are shaped advantageously into a shoulder in an area adjoining the first and second contact areas, thereby offering the possibility that the connecting device may be picked up by a tool. In order to also enable insertion of the connecting element into a circuit board by machine, the ends of the electrical conductors are directed to the same side in the first and second contact areas in the direction of a circuit board.

Advantageously, the insulation has an elongated opening between each pair of electrical conductors. This removal of material increases the flexibility of the connecting device and reduces the transmission of vibrations through the connecting device.

Advantageously, the electrical conductors are of flat design in the area of the insulation and of round design in the contact areas. This enables the round ends of the electrical conductor to be guided easily into contact openings of circuit boards, and the flat area of the electrical conductor can easily be plastically deformed along the course of the conductor, and is dimensionally stable against forces that act at right angles to the plane of the flat conductor.

By preference, the electrical conductor is made of tin-plated copper. Copper not only contributes to good electrical conductivity, but is also readily shaped. The tin-plated surface protects the copper against corrosion, and provides a readily solderable surface.

Advantageously, the electrical conductors and the insulation are shaped as a loop between the first and the second contact areas. This configuration makes it possible for forces that act on one contact area of the connecting device due to vibrations of the circuit board to be damped over the length of the loop, so that only small forces are transmitted to the other contact area.

Advantageously, the connecting device is installed using a tool according to the present invention. The shoulders of the connecting device are grasped in an advantageous manner from below and from the side by a gripper, while a plunger presses the shoulder against the gripper from above.

Thus, using this tool, the connecting device may be picked up and inserted in an advantageous manner by machine and automatically.

DETAILED DESCRIPTION

Figure 1:
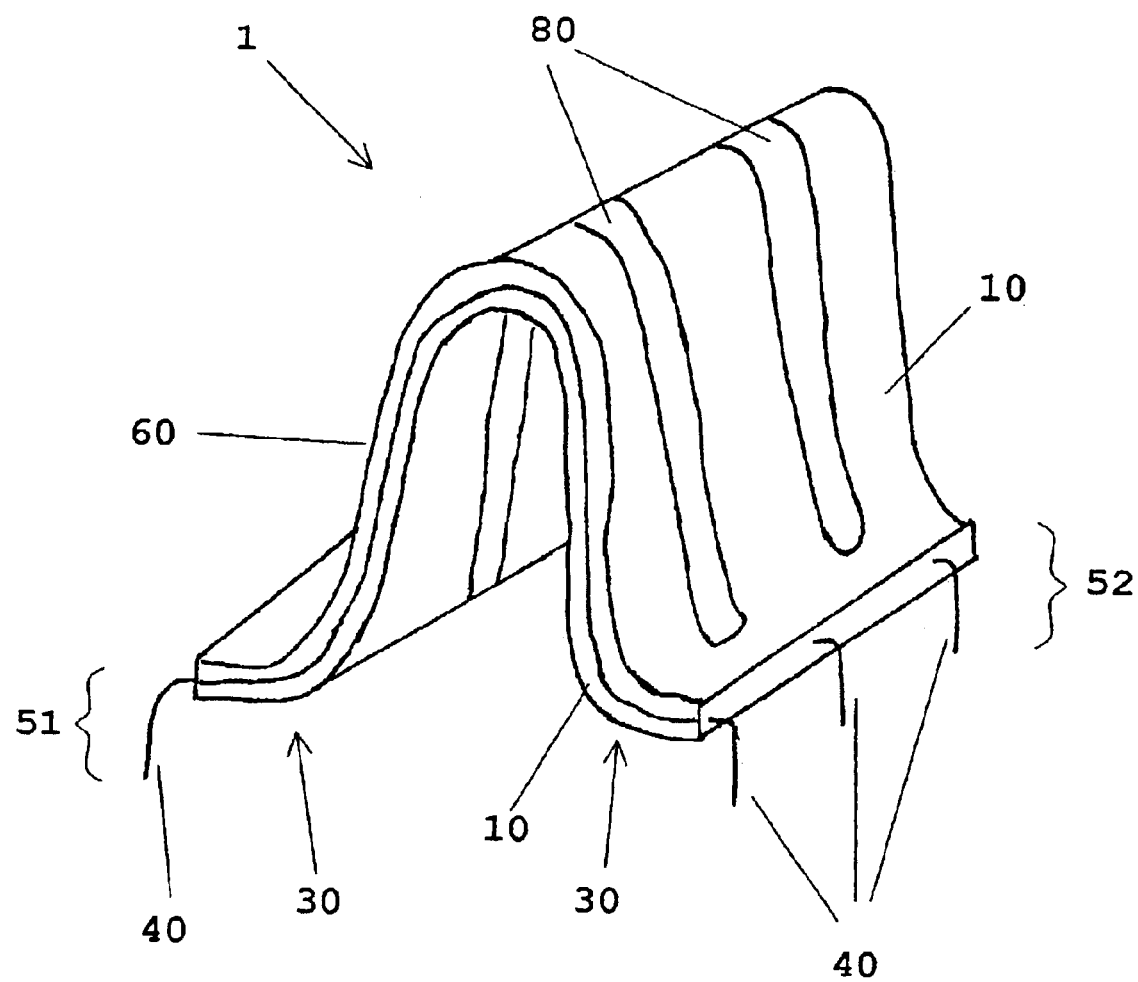
FIG. 1 shows a schematic perspective view of the connecting device according to the present invention.

FIG. 1 shows a connecting device according to the present invention in schematic perspective view. Three flexible electrical conductors 40 are positioned adjacent to each other and are jointly surrounded by an insulation 10 of an electrically non-conductive material. Each electrical conductor 40 is free of insulation 10 in its end areas in first and second contact areas 51, 52. Between first and second contact areas 51, 52, electrical conductor 40 and insulation 10 form a loop 60 which is similar in shape to a bell-shaped curve. In the areas in which insulation 10 adjoins first and second contact areas 51, 52, electrical conductors 40 and insulation 10 run out flat to a shoulder 30. Between each pair of electrical conductors 40 there is an opening 80 in insulation 10. Opening 80 follows the course of electrical conductor 40, and is located in the area of loop 60. The ends of the individual electrical conductors 40 are bent in contact areas 51, 52 opposite the particular shoulder 30 and are directed to the same side, so that the ends of electrical conductors 40 point in the direction of a circuit board during insertion, and contact areas 51, 52 are able to enter into contact openings of a circuit board, which is not shown.

The shape of loop 60 is controlled automatically as a result of the materials selected for the electrical conductors and insulation and their longitudinal dimensions. The length of loop 60 may be adapted here to the particular application and the available space. Loop 60 runs out to a shoulder 30 in the direction of contact areas 51, 51. The transition from shoulder 30 to loop 60 may typically be assumed at slope turning points or discontinuities. In the case of a bell-shaped configuration, loop 60 would lie by definition between the turning points, while shoulders 30 run out shallowly from the turning points in the direction of contact areas 51, 52. However, the transitions from loop 60 to shoulders 30 may also be right-angled, for example. In this case shoulder 30 then extends from the right-angled deformation to the edge areas. An omega shape would also be conceivable as an additional design. The shape of shoulder 30 and also of loop 60 may be modified in a multitude of ways, as long as there is assurance that connecting device 1 may be picked up by a tool preferably in the area of shoulder 30 and inserted automatically. The angle between shoulder 30 and electrical conductors 40 in contact areas 51, 52 is chosen so that the electrical conductors are able to enter into contact openings of a circuit board during insertion. With a shallow run-out of shoulder 30, this angle is typically around 90°.

Figure 2:
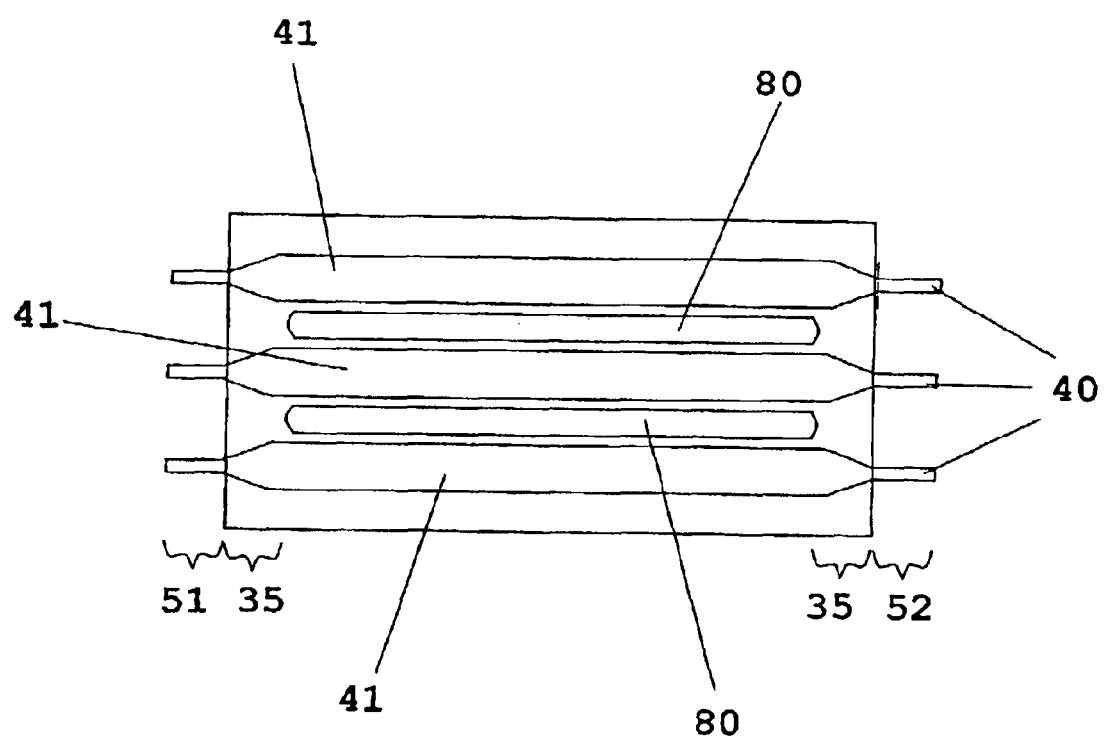
FIG. 2 shows a connecting device according to FIG. 1, having openings.

FIG. 2 shows a connecting device 1 according to FIG. 1 which has not yet been bent. Three electrical conductors 40 are positioned adjacent to each other and are jointly surrounded by a rectangularly cut insulation 10. The round ends of electrical conductors 40 protrude from the short sides of rectangular insulation 10 and form a first and a second contact area 51, 52. Between first and second contact areas 51, 52, originally round electrical conductor 40 widens to a flat ribbon conductor 41, the plane of ribbon conductor 41 following the plane of insulation 10. Between each pair of electrical conductors 40 there is an opening 80 in insulation 10. Opening 80 extends from a first contact area 51 to a second contact area 52, while opening 80 extends only to an edge area 35 of insulation 10. After connecting device 1 is bent, edge area 35 forms shoulder 30.

This construction has the advantage that the flattened shape of electrical conductor 40 both improves the plastic deformability of conductor 40 and increases the flexibility of formed loop 60. Depending on the application, however, a continuous round electrical conductor would also be conceivable, as well as a flat ribbon conductor which is also led shallowly outward in contact areas 51, 52. To further increase the flexibility of connecting device 1, there is an opening 80 in insulation 10 between each pair of electrical conductors 40. The removal of insulation material in these areas reduces the stiffness of insulation 10 and thus increases the flexibility of connecting device 1. As a result of these measures, vibrations acting on one of contact areas 51, 52 are transmitted only to a very small extent or not at all to the other contact area. Openings 80 may be produced in a simple manner using a stamping process. Flat area 41 of electrical conductor 40 is produced, starting from a round wire, by compressing and flattening the wire in the middle area, for example by rolling pressing. Insulation 10 is in two layers. Electrical conductors 40 are positioned side-by-side on a first layer and are laminated with a second layer. Alternatively, electrical conductors 40 may also be injected in plastic. A number of electrically non-conductive materials are possible for insulation 10. By preference polymers are used, such as polyimide for example, but less expensive solutions using electrically insulating paper are also possible.

Figure 3:
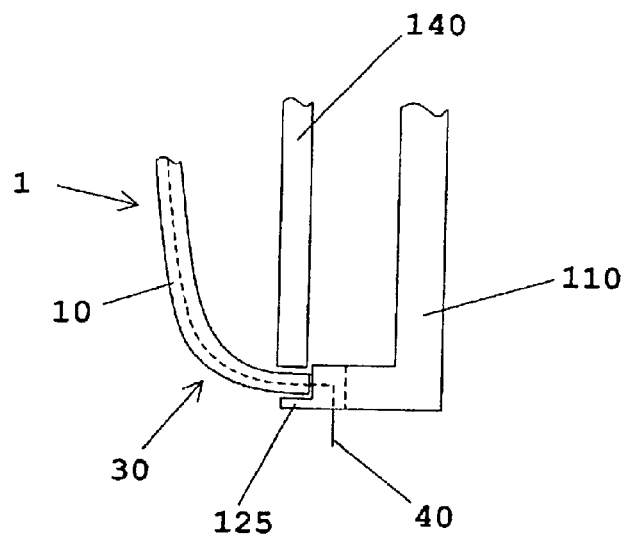
FIG. 3 shows a cross section of a tool according to the present invention, in the area of a shoulder.

FIG. 3 shows the principle of a design for a tool 100 for picking up and inserting connecting device 1. Since this is a symmetrical tool, and no special pick-up is provided for loop 60, FIG. 3 shows only the functionally relevant area of a shoulder 30.

An L-shaped gripper 110 is used to pick up shoulder 30. The short arm of L-shaped gripper 110 is tapered down in steps at the end of the arm. The tapering forms a gripping extension 125 on which shoulder 30 lies. The step resulting from the tapering of the gripper serves as a stop 130 for insulation 10 of shoulder 30. A plunger 140 which is located above gripping extension 125 presses shoulder 30 against gripping extension 125.

Figure 4:
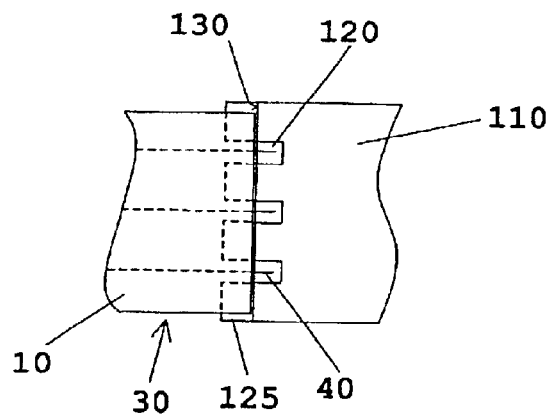
FIG. 4 shows a top view of a tool according to the present invention, in the area of a shoulder.

FIG. 4 shows a top view of tool 100 without plunger 140. Gripper 110 is structured like a comb in the area of gripping extensions 125. Shoulder 30 lies on comb-like gripping extensions 125. In the areas in which the electrical conductors protrude from insulation 10 of connecting device 1, there are openings 120 which enable electrical conductors 40 to be extended in the direction of the circuit board. Shoulder 30, and consequently connecting device 1, is thus supported by housing extensions 125 in the area of the insulation, while the contact areas remain free due to openings 120.

Figure 5:
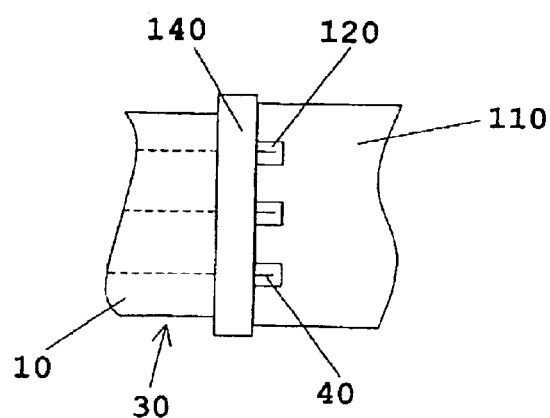
FIG. 5 shows a top view of a tool according to the present invention, having a gripper and a plunger.

FIG. 5 shows an arrangement according to FIG. 4, in which a plunger 140 presses shoulder 30 against gripping extension 125 over the entire extent of gripping extension 125.

Tool 100 is part of a larger component insertion machine, which is not shown. The grippers and plungers are positioned symmetrically on two sides of a tool head. The positions of the grippers and plungers may be shifted, making it possible to pick up a curved connecting device which is prepared to be picked up using the grippers and gripping extensions and held by plungers 140. Tool 100 conveys connecting device 1 to prepared circuit boards and inserts contact areas 51, 52 of electrical conductors 40 into contact openings of the circuit boards which are provided for that purpose. After connecting device 1 is fixed in place, gripper 110 opens, and tool 100 is again able to pick up a new connecting device 1. The design and shape of connecting device 1 according to the present invention makes it possible for this component insertion sequence to proceed automatically by machine.

What is claimed is:

1. A connecting device for achieving a flexible electrical connection of circuit boards, comprising:
   a plurality of flexible electrical conductors positioned adjacent to each other; and
   a common insulation surrounding the flexible electrical conductors, the common insulation being made of an electrically non-conductive material, wherein:
   each flexible conductor includes in respective end areas a first contact area and a second contact area without the common insulation,
   the flexible electrical conductors and the common insulation are plastically deformable and are shaped in such a way that the first contact area and the second contact area of each of the flexible conductors are directed to a same side,
   the flexible electrical conductors and the common insulation adjacent to the first contact area and the second contact area are shaped into a shoulder,
   the shoulders are shaped in such a way that the flexible electrical conductors and the common insulation can be picked up by a tool, and
   the first contact area and the second contact area are capable of connection to at least one of the circuit boards by machine.

2. The connecting device as recited in claim 1, wherein:
   the common insulation includes at least one elongated opening between each pair of the flexible electrical conductors, and
   the elongated opening extends at most as far as a curved area.

3. The connecting device as recited in claim 1, wherein:
   the flexible electrical conductors form a loop running out to the shoulders,
   the loop and the shoulder are shaped as a bell-shaped curve, and
   the shoulder runs out shallowly in a direction of the first contact area and the second contact area.

4. The connecting device as recited in claim 1, wherein:
   the flexible electrical conductors are flat in an area of the common insulation and are round in the first contact area and the second contact area.

5. The connecting device as recited in claim 1, wherein:
   the flexible electrical conductors include tin-plated copper.

6. The connecting device as recited in claim 1, wherein:
   the flexible electrical conductors and the common insulation are shaped into a loop between the first contact area and the second contact area.

* * * * *